(12) United States Patent
Chang et al.

(10) Patent No.: US 11,756,640 B2
(45) Date of Patent: Sep. 12, 2023

(54) MIM EFUSE MEMORY DEVICES AND FABRICATION METHOD THEREOF

(71) Applicant: Taiwan Semiconductor Manufacturing Company, Ltd., Hsinchu (TW)

(72) Inventors: Meng-Sheng Chang, Chu-bei (TW); Chia-En Huang, Xinfeng Township (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/396,398

(22) Filed: Aug. 6, 2021

(65) Prior Publication Data
US 2023/0043443 A1 Feb. 9, 2023

(51) Int. Cl.
*G11C 17/00* (2006.01)
*G11C 17/16* (2006.01)
*H10B 20/20* (2023.01)

(52) U.S. Cl.
CPC .......... *G11C 17/165* (2013.01); *H10B 20/20* (2023.02)

(58) Field of Classification Search
CPC .................................. G11C 17/165
USPC ........................................ 365/100
See application file for complete search history.

(56) References Cited

U.S. PATENT DOCUMENTS

2014/0071741 A1* 3/2014 Kim ............... G11C 17/18
  365/158
2022/0293749 A1* 9/2022 Chen ............. H01L 21/486

* cited by examiner

*Primary Examiner* — Hoai V Ho
(74) *Attorney, Agent, or Firm* — FOLEY & LARDNER LLP

(57) ABSTRACT

A memory device is disclosed. The memory device includes a plurality of memory cells, each of the memory cells including an access transistor and a resistor coupled to each other in series. The resistors of the memory cells are each formed as one of a plurality of interconnect structures disposed over a substrate. The access transistors of the memory cells are disposed opposite a first metallization layer containing the plurality of interconnect structures from the substrate.

20 Claims, 10 Drawing Sheets

MIM EFUSE MEMORY DEVICES AND FABRICATION METHOD THEREOF

BACKGROUND

In general, memory devices may be volatile memory devices and non-volatile memory (NVM) devices. Volatile memory devices can store data while power is provided but may lose the stored data once the power is shut off. A one-time programmable (OTP) memory device is a type of NVM device often used for read-only memory (ROM). When the OTP memory device is programmed, the device cannot be reprogrammed. An eFuse memory cell is a type of OTP memory device that includes a one-transistor, one-resistor (1T1R) configuration. As technology continues to advance and follow Moore's law, it is desirable to have devices that have small cell areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
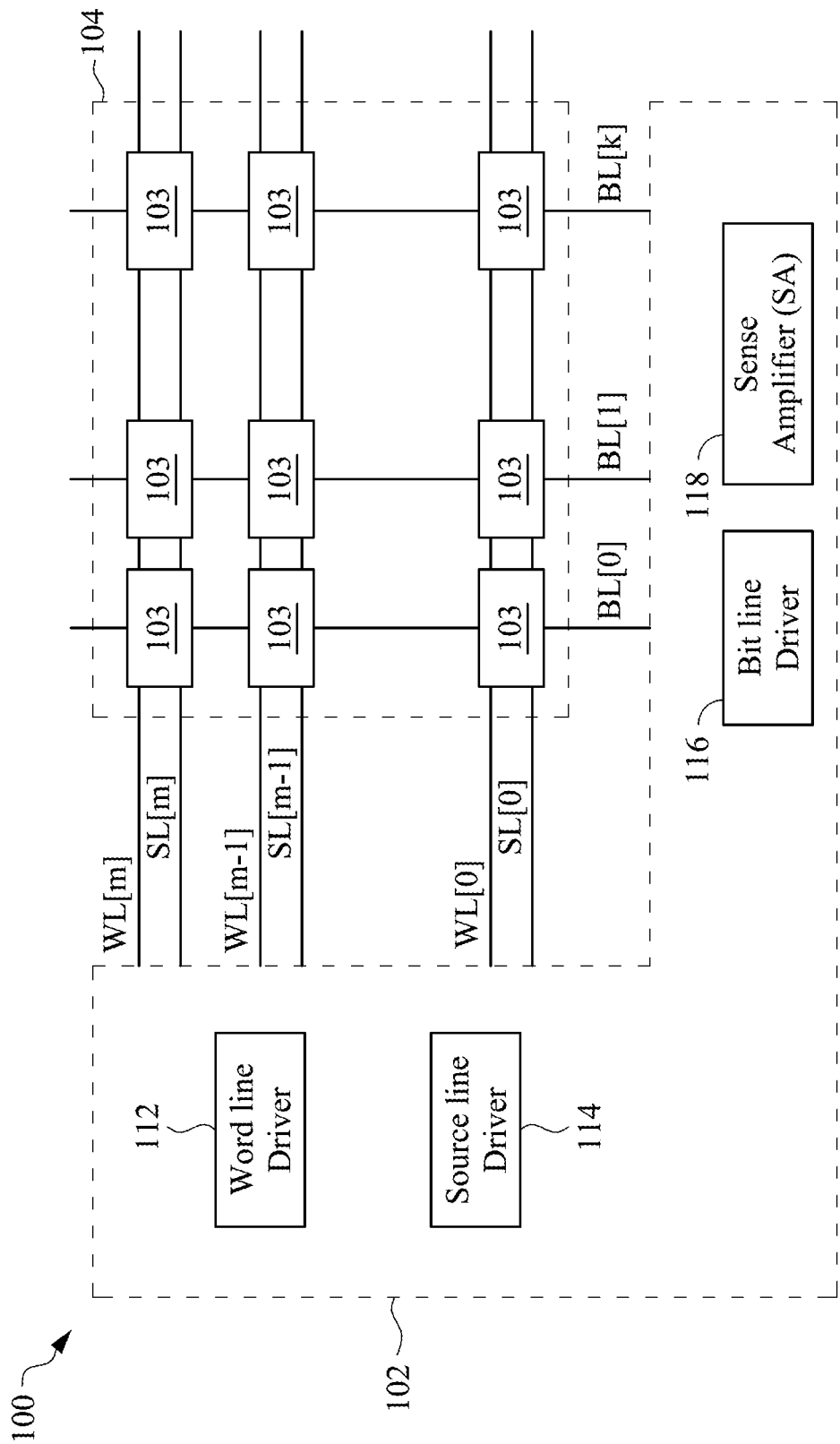
FIG. 1A illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuit (IC) technology advances, IC features (e.g., transistor gate length) continue to decrease, thereby allowing for more circuitry to be implemented in an IC. One challenge with implementing OTP memory devices such as, for example, a fuse, an electronic fuse (eFuse), etc., in an IC is that eFuse size reduction has not advanced at nearly the same rate as the reduction in size of transistor features. The eFuse memory is a type of OTP memory that includes a 1T1R configuration. Typically, the resistor is connected to a bit line, and an access transistor is gated by the word line. The resistor includes a metal-insulator-metal (MIM) structure which includes a metal-based material whose resistance can change depending on the voltage difference across the MIM.

A typical eFuse memory cell includes the access transistor formed on a substrate, and the "fuse" (i.e., the resistor) is formed over the access transistor in a metallization layer, e.g., metallization layer M2. The eFuse memory cells are formed laterally from control circuits which are also formed on a substrate. Because the control circuits and the access transistors are formed laterally from each other, an eFuse memory array takes up a lot of area on the memory chip. Furthermore, there eFuse memory array is typically connected to peripheral circuits, e.g., a power switch circuit and a header circuit, that provide bias voltages to a bit line during a programming or reading process. Because these peripheral circuits are also formed laterally from the eFuse memory array, a large amount of area is taken up. Accordingly, there is a desire to develop an eFuse memory cell that has a smaller cell area.

In the present disclosure, a novel eFuse memory cell structure can be formed to provide several advantages over the current technology. For example, the access transistor of the eFuse memory cell can be formed over the eFuse resistor, which is typically disposed in a metallization layer, e.g., metallization layer M2. The access transistors can be formed during a BEOL process and connected to the eFuse resistor through one or more metallization layers and one or more via structures. Also, some of the peripheral circuits can be formed lateral to the access transistors such as the power switch and the header circuits. Because the access transistors and the peripheral circuits are moved to above the eFuse resistors and control circuits that are formed on the substrate, the eFuse cell area can be advantageously reduced such that the density of the eFuse memory chip can be increased.

FIG. 1A illustrates a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell 103 and a controller (also referred to as "control circuit") 102 coupled to control an operation of the memory cell 103. In the example configuration in FIG. 1A, the memory device 100 comprises a plurality of memory cells 103 arranged in a plurality of columns and rows in a memory array 104. The memory device 100 further comprises a plurality of word lines WL[0] to WL[m] extending along the rows, a plurality of source lines SL[0] to SL[m] extending along the rows, and a plurality of bit lines (also referred to as "data lines") BL[0] to BL[k] extending along the columns of the memory cells 103. Each of the memory cells 103 is coupled to the controller 102 by at least one of the word lines, at least one of the source lines, and at least one of the bit lines. Examples of word lines include, but are not limited to, read word lines for transmitting addresses of the memory cells 103 to be read from, write word lines for transmitting addresses of the memory cells 103 to be written to, or the like. In at least one embodiment, a set of word lines is configured to perform as both read word lines and write word lines. Examples of bit lines include read bit lines for transmitting data read from the memory cells 103 indicated by corresponding word lines, write bit lines for transmitting data to be written to the memory cells 103 indicated by corresponding word lines, or the like. In at least one embodiment, a set of bit lines is configured to perform as both read bit lines and write bit lines. In one or more embodiments, each memory cell 103 is coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1A. In at least one embodiment, the source lines SL are omitted.

In the example configuration in FIG. 1A, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is coupled to the memory array 104 via the word lines WL. The word line driver 112 is configured to decode a row address of the memory cell 103 selected to be accessed in a read operation or a write operation. The word line driver 112 is configured to supply a voltage to the selected word line WL corresponding to the decoded row address, and a different voltage to the other, unselected word lines WL.

The source line driver 114 is coupled to the memory array 104 via the source lines SL. The source line driver 114 is configured to supply a voltage to the selected source line SL corresponding to the selected memory cell 103, and a different voltage to the other, unselected source lines SL.

The bit line driver 116 (also referred as "write driver") is coupled to the memory array 104 via the bit lines BL. The bit line driver 116 is configured to decode a column address of the memory cell 103 selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL.

The SA 118 is coupled to the memory array 104 via the bit lines BL. In a read operation, the SA 118 is configured to sense data read from the accessed memory cell 103 and retrieved through the corresponding bit lines BL. The described memory device configuration is an example, and other memory device configurations are within the scopes of various embodiments. In at least one embodiment, the memory device 100 is NVM device, and the memory cells 103 are OTP memory cells. Other types of memory are within the scopes of various embodiments. Example memory types of the memory device 100 include, but are not limited to, eFuse, anti-fuse, magnetoresistive random-access memory (MRAM), or the like.

Figure 1B:
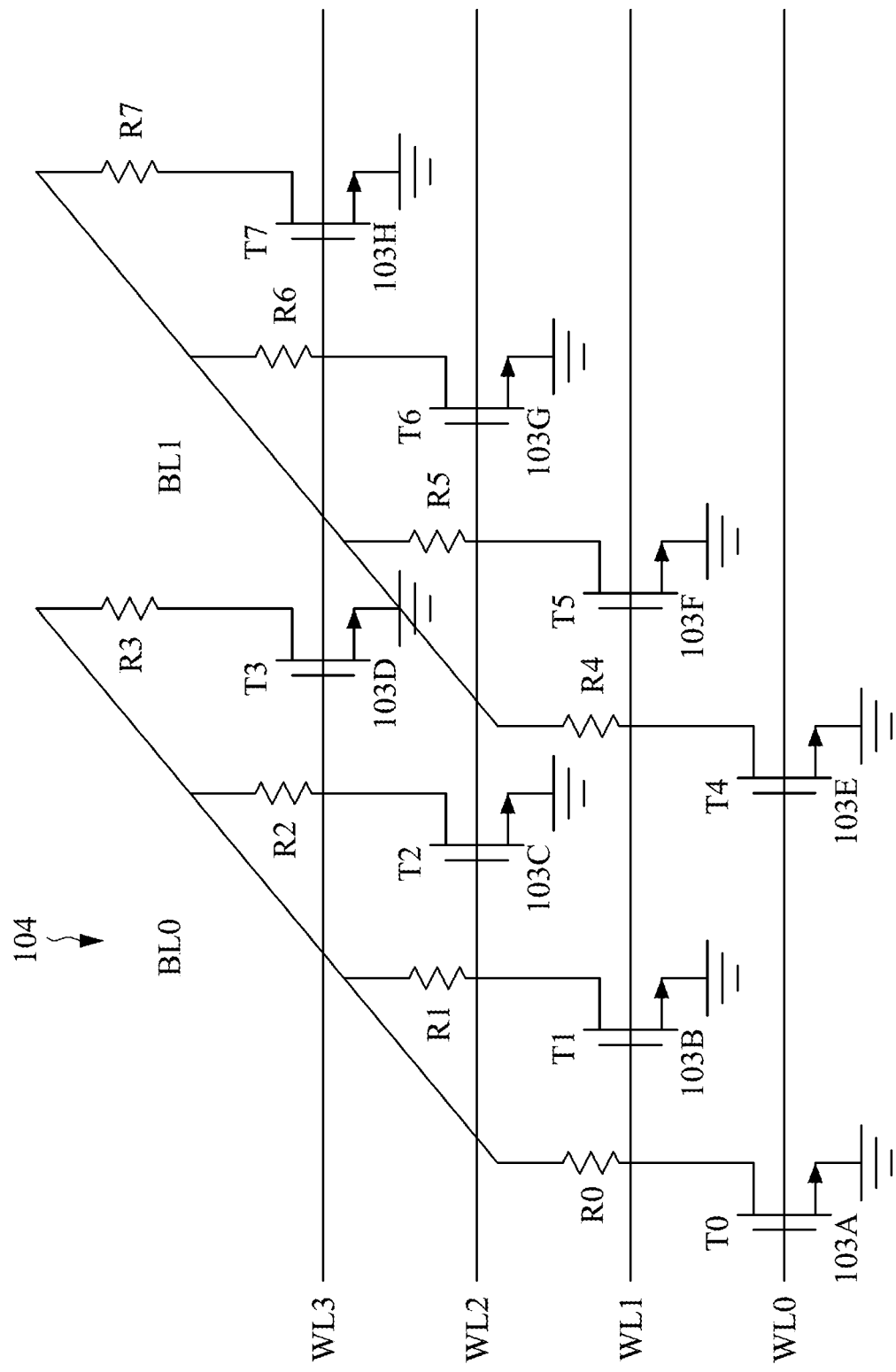
FIG. 1B illustrates an example circuit diagram of a portion of the memory device of FIG. 1A, in accordance with some embodiments.

FIG. 1B illustrates a portion of the memory array 104 (FIG. 1A), in accordance with some embodiments. As shown, the memory array 104 comprises a plurality of memory cells 103, for example, 103A, 103B, 103C, 103D, 103E, 103F, 103G, and 103H. Although eight memory cells are shown in FIG. 1B, it should be understood that the memory array 104 can include any number of memory cells 103, while remaining within the scope of present disclosure.

Each of the memory cells 103A to 103H has a 1T1R configuration with the source line SL grounded, and comprises a transistor and a resistor coupled in series between a corresponding bit line and SL. For example, the memory cells 103A to 103H correspondingly comprise fuse resistors R0, R1, R2, R3, R4, R5, R6, and R7, and access transistors T0, T1, T2, T3, T4, T5, T6, and T7. The fuse resistors R0 to R3 of the memory cells 103A to 103D are commonly coupled to a bit line BL0. Gate terminals of the access transistors T0, T1, T2, T3 are correspondingly coupled to word lines WL0, WL1, WL2, and WL3. The fuse resistors R4-R7 of the memory cells 103E-103H are commonly coupled to a bit line BL1. Gate terminals of the access transistors T4-T7 are correspondingly coupled to the word lines WL0, WL1, WL2, WL3. The memory cells 103A-103D commonly coupled to the bit line BL0 correspond to a first string of memory cells, and the memory cells 103E-103H commonly coupled to the bit line BL1 correspond to a second string of memory cells. In at least one embodiment, each of the memory cells 103A-103H corresponds to a memory cell 103, each of the bit lines BL0, BL1 corresponds to a bit line BL, and each of the word lines WL0, WL1, WL2, WL3 corresponds to a word line WL in the memory device 100. In at least one embodiment, one or more advantages described herein are achievable in the memory array 104.

The transistors in this disclosure are shown to have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Furthermore, although each of the access transistors T0-T7 are shown in FIG. 1B as one transistor, embodiments are not limited thereto. For example, each of the access transistors T0-T7 can include more than one transistor ("sub-transistor") that are connected to one another in parallel. For example, each of the sub-transistors of access transistor T0 can include a gate that is connected to the word line WL0, a source terminal that is connected to ground, and drain terminal that is connected to the fuse resistor R0.

In some embodiments, the controller 102 includes the word line driver 112, source line driver 114, bit line driver 116, and sense amplifier 118, as well as a plurality of other circuits such as one or more multiplexors, one or more pass gate transistors (or pass transistors), and/or one or more level shifters, where each of these other circuits can include p-type or n-type transistors. The multiplexors, the pass gate transistors, the sense amplifier 118, and the level shifters can be generally disposed on opposing sides of the word line driver 112, source line driver 114, and/or bit line driver 118. The controller 102 can be disposed on the substrate and connected to the memory array 104 through one or more bit lines BL, one or more source lines SL and/or one or more word lines WL that can be disposed in one or more metallization layers and/or one or more via structures.

Figure 2:
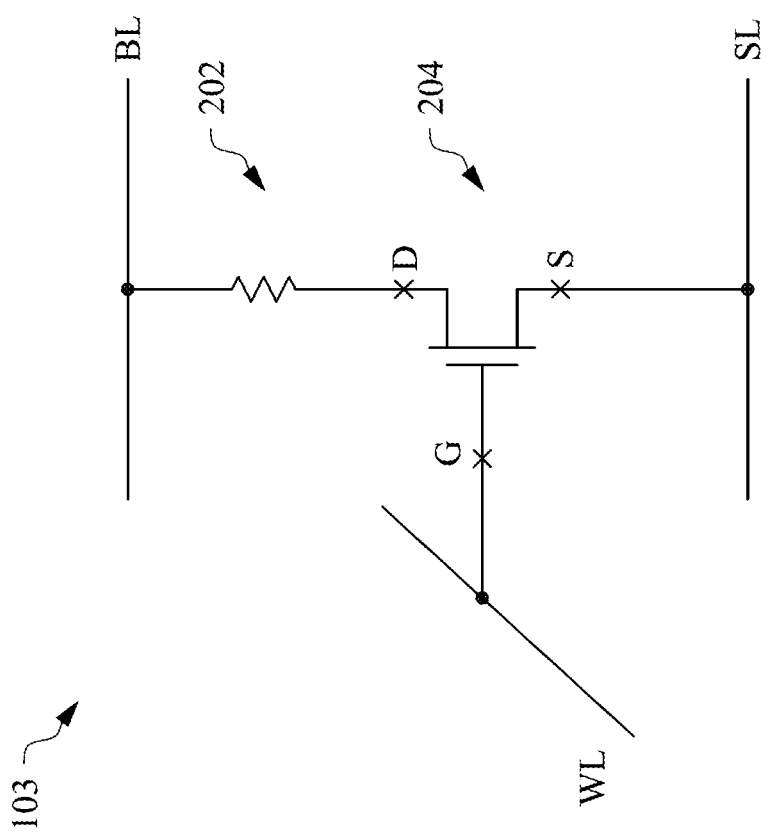
FIG. 2 illustrates an example circuit diagram of a memory cell of the memory device of FIGS. 1A-1B, in accordance with some embodiments.

FIG. 2 illustrates an example configuration of the eFuse cell 103 (FIG. 1A), in accordance with some embodiments. The eFuse cell 103 is implemented as a 1T1R configuration, for example, a fuse resistor 202 serially connected to an access transistor 204. It, however, should be understood that any of various other fuse configurations that exhibit the fuse characteristic may be used by the eFuse cell 103 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 202 is formed of one or more metal structures. For example, the fuse resistor 202 may be one of a number of interconnect structures in one of a number metallization layers that are disposed above or below the access transistor 204. Specifically, the access transistor 204 is formed over a major surface of a semiconductor substrate, which is sometimes referred to as part of front-end-of-line (FEOL) processing. Over the FEOL processing, a number of metallization layers, each of which includes a number of interconnect (e.g., metal) structures, are typically formed, which are sometimes referred to as part of BEOL processing. During the BEOL processing, or between the FEOL and BEOL processing, there can be processing steps where local electrical connections between transistors and metal gate contacts are formed during the MEOL processing.

In this disclosure, a metallization layer (or interconnect structure) refers to a layer formed during the MEOL or BEOL process in which multiple metal or interconnect structures are formed and laterally separated from each other by interlayer dielectric (ILD). A top surface and a bottom surface of the ILD can define a boundary of the metallization layer. In the memory cell 200, the metallization layers in the memory cell 200 can include interconnect structures (e.g., MD, M0, M1, M2, M3, M3, M4, M5, M6 and M7), which are each formed in their respective metallization layers. Although a certain number of interconnect structures are described, embodiments are not limited thereto, and fewer or more metallization layers and interconnect structures can be formed. Furthermore, a plurality of vias structures (e.g., VD, VIA0, VIA1, VIA2, VIA3, VIA4, VIA5, and VIA6) are formed and electrically connecting adjacent interconnect structures to each other. For example, the via structure VIA1 electrically connects the interconnect structure M0 to the interconnect structure M1, the via structure VIA2 electrically connects the interconnect structure M1 to the interconnect structure M2, and so on and so forth.

With the fuse resistor 202 (of the eFuse cell 103) embodied as a metal structure, the fuse resistor 202 may present an initial resistance value (or resistivity), for example, as fabricated. To program the eFuse cell 103, the access transistor 204 (if embodied as an n-type transistor) is turned on by applying a (e.g., voltage) signal, corresponding to a logic high state, through a WL to a gate terminal of the access transistor 204. Concurrently or subsequently, a high enough (e.g., voltage) signal is applied on one of the terminals of the fuse resistor 202 through a BL. With the access transistor 204 turned on to provide a (e.g., program) path from the BL, through the fuse resistor 202 and access transistor 204, and to a SL, such a high voltage signal can burn out a portion of the corresponding metal structure (the fuse resistor 202), thereby transitioning the fuse resistor 202 from a first state (e.g., a short circuit) to a second state (e.g., an open circuit). Accordingly, the eFuse cell 103 can irreversibly transition from a first logic state (e.g., logic 0) to a second logic state (e.g., logic 1), which can be read out by applying a relatively low voltage signal on the BL and turning on the access transistor 204 to provide a (e.g., read) path.

Figure 3A:
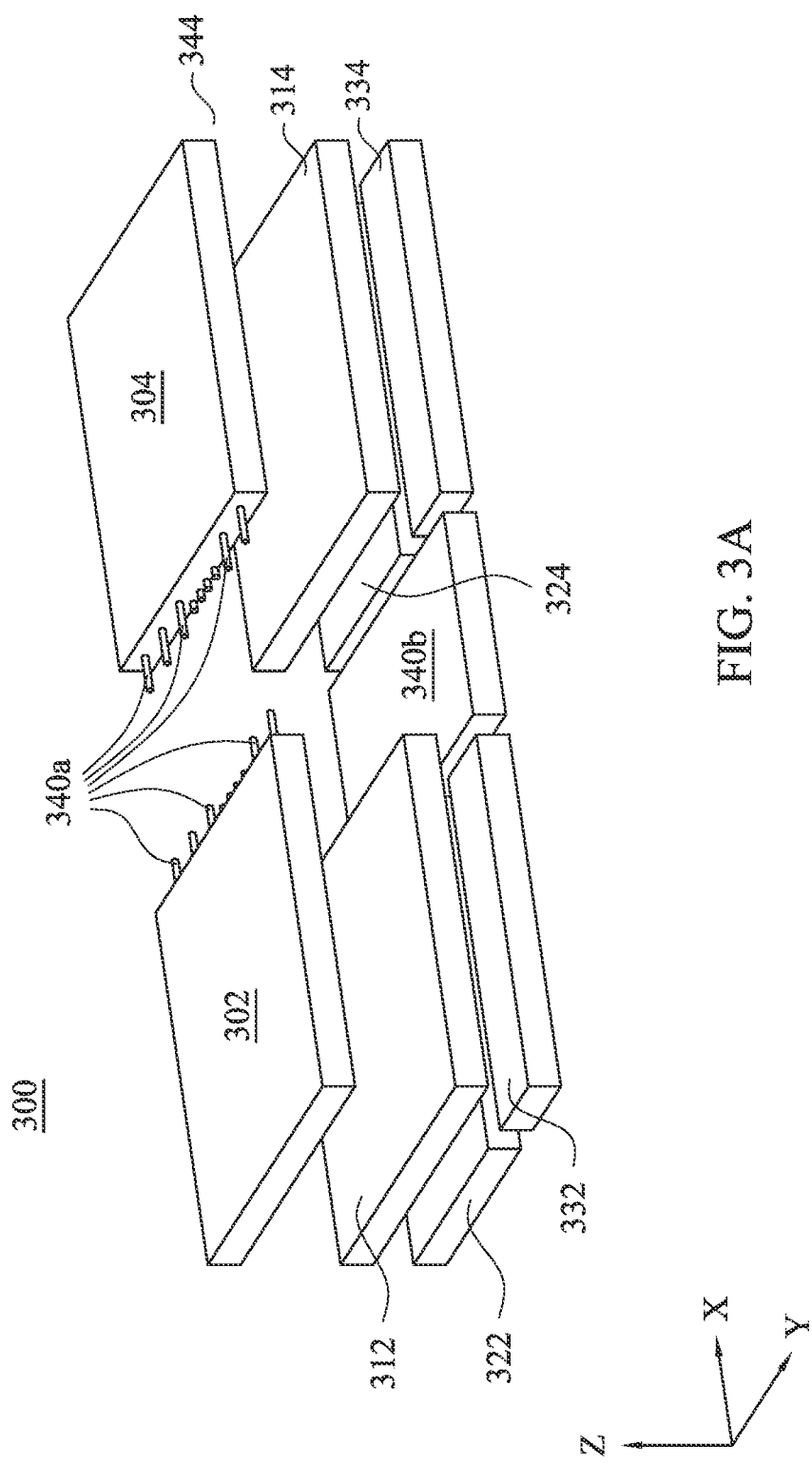
FIG. 3A illustrates a three-dimensional (3D) perspective view of a block diagram of an example memory device, in accordance with some embodiments.

FIG. 3A illustrates a 3D perspective view of a block diagram of an example memory device 300, in accordance with some embodiments. The memory device 300 includes a plurality of access transistors 302 and 304 (e.g., access transistor 204), a plurality of fuse resistors 312 and 314 (e.g., fuse resistor 202), control circuits 322 and 324 (e.g., multiplexors, pass gate transistors, level shifters, source line driver 114, and bit line driver 116), a word line driver 340b (e.g., word line driver 112), and sense amplifiers 332 and 334 (e.g., sense amplifier 118). Although in FIG. 3A the sense amplifier 332 and 334 are shown separately from the control circuits 322 and 324, embodiments are not limited thereto. For example, the sense amplifier 332 can be included in the control circuit 322, and the sense amplifier 334 can be included in the control circuit 324. Although FIG. 3A shows a certain number of blocks of circuits, elements are not limited thereto, and there can be more or fewer circuits in the memory device 300.

The access transistors 302 can be disposed over the fuse resistors 312, the control circuits 322, and the sense amplifiers 332, and the access transistors 304 can be disposed over the fuse resistors 314, the control circuits 324, and the sense amplifiers 334. As discussed above, the sense amplifiers 332 and 334 can be disposed with the control circuits 322 and 324, respectively. In this disclosure, the access transistors 302 and 304 can be formed as back-gate transistors. For example, the gate terminal of the access transistors 302 and 304 can be formed below an active region of the access transistors 302 and 304 such that the source and drain terminals of the access transistors 302 and 304 are formed over the gate terminal. In other words, the gate terminal can be closer to the substrate than the source and drain terminals.

The fuse resistors 312 can be disposed between the access transistors 302 and the control circuits 322/sense amplifiers 332, and the fuse resistors 314 can be disposed between the access transistors 304 and the control circuits 324/sense amplifiers 334. Although not shown in FIG. 3A, there can be one or more metallization layers including interconnect structures that connect the fuse resistors 312 to the access transistors 302 and connect the fuse resistors 314 to the access transistors 304. Furthermore, there can be one or more metallization layers including interconnect structures between the fuse resistors 312 and the control circuits 322/sense amplifier 332, and there can be one or more metallization layers including interconnect structures between the fuse resistors 314 and the control circuits 324/sense amplifiers 334.

The control circuits 322 and 324 are connected to the access transistors 302 and 304 via the word lines 340a. Although not shown, the word lines 340a can be disposed in the metallization layers including interconnect structures such that the control circuits 322 and the control circuits 324 can be electrically connected to gate terminals of the access transistors 302 and 304 via the word lines 340a. The sense amplifiers 332 and 334 can be electrically connected to the fuse resistors 312 and 314, respectively, through a plurality of metallization layers formed between the sense amplifiers 332 and 334 and the fuse resistors 312 and 314, respectively. The word line driver 340b can be connected to the word lines 340a through a plurality of metallization layers including interconnect structures and a plurality of via structures. The word line driver 340b can also be electrically connected to the control circuits 322 and 324 and the sense amplifiers 332 and 334.

Figure 3B:
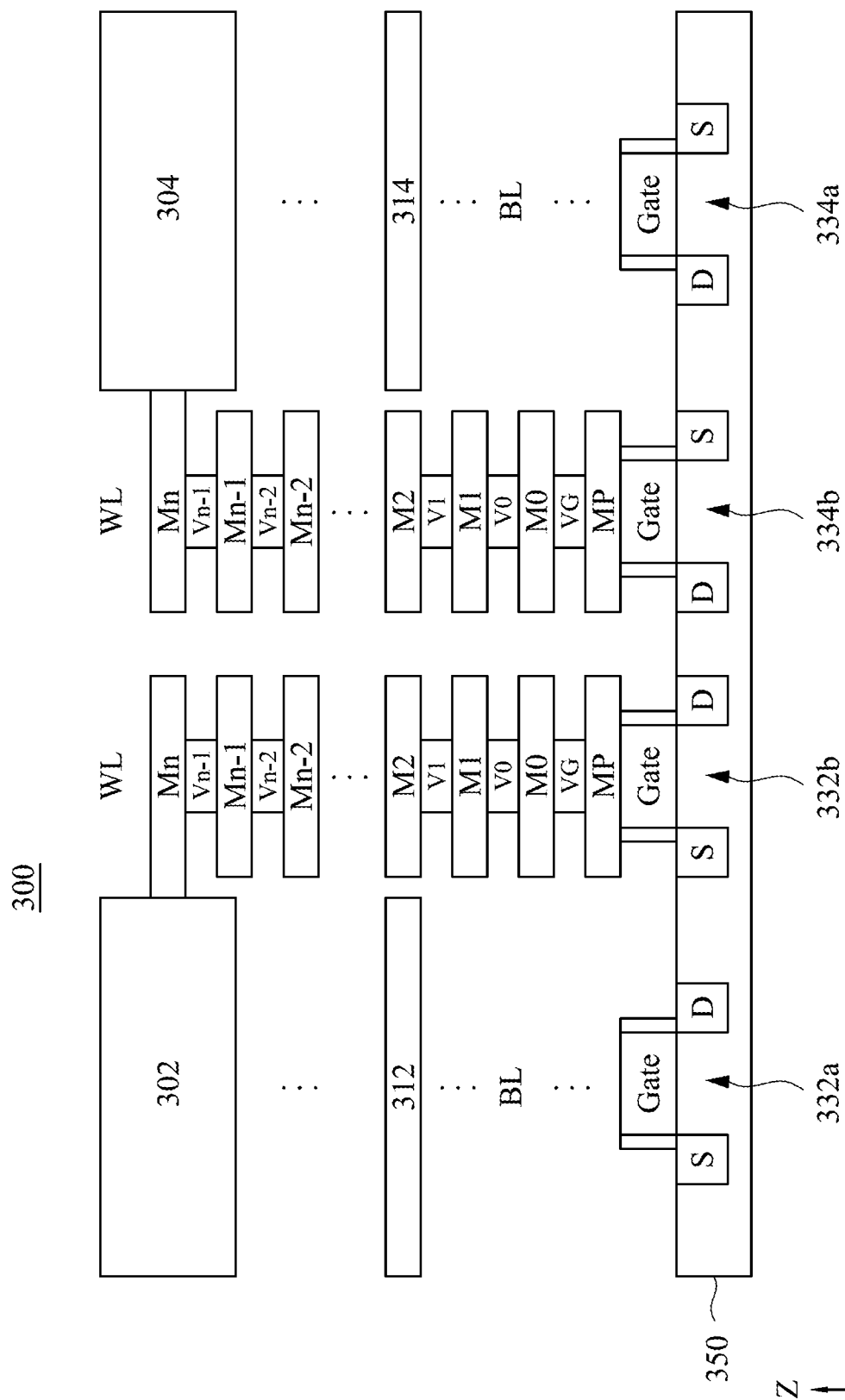
FIG. 3B illustrates a cross-sectional view of the memory device of FIG. 3A, in accordance with some embodiments.

FIG. 3B illustrates a cross-sectional view of the example memory device 300 of FIG. 3A, in accordance with some embodiments. The cross-sectional view shows the access transistors 302 and 304 and the fuse resistors 312 and 314. The cross-sectional view also shows sense amplifier transistors 332a and 334a and word line driver transistors 332b and 334b which are disposed on a substrate 350.

The sense amplifier transistors 332a and 334a can be transistors included in the sense amplifier of the memory device 300, e.g., sense amplifier 118, 332, and 334. The sense amplifier transistors 332a and 334a are connected to the fuse resistors 312 and 314, respectively, via a bit lines BL. The bit lines BL are formed through a plurality of metallization layers and via structures that are stacked on top of one another. Although FIG. 3B is discussed with respect to the transistors 332a and 334a being sense amplifier transistors that are part of the sense amplifier of the memory device 300, embodiments are not limited thereto. For example, the transistors 332a and/or 334a can be transistors of the control circuits 322 and 334 that are connected to the bit lines BL. Furthermore, although not shown, there can be a plurality of other transistors formed on the substrate 350 that are connected to the bit line BL (e.g., see FIGS. 6A-6B). Furthermore, although not shown, a plurality of other transistors that are part of the control circuits 322 and 334 can be formed on the substrate, such as transistors included in the multiplexors, pass gate transistors, level shifters, bit line driver, source line driver, and others.

The fuse resistors 312 and 314 can be connected to the access transistors 302 and 304, respectively, through a plurality of interconnect structures and via structures. For example, a drain terminal of one of the access transistors 302 is connected to one of the fuse resistors 312 through a plurality of interconnect structures (e.g., M3, M4 . . . Mn) and a plurality of via structures (e.g., V2, V3 . . . Vn−1). Also, a drain terminal of one of the access transistors 304 is connected to one of the fuse resistors 314 through a plurality of interconnect structures (e.g., M3, M4 . . . Mn) and a plurality of via structures (e.g., V2, V3 . . . Vn−1). Although it is shown that the fuse resistors 312 and 314 are disposed in the metallization layer M2, embodiments are not limited thereto. For example, the fuse resistors 312 and 314 in other embodiments can be disposed in other metallization layers (e.g., M1, M3, etc.).

The word line driver transistors 332b and 334b can be transistors in the word line driver 340b. Each of the word line driver transistors 332b and 334b has a gate terminal, a source terminal and a drain terminal. The word line driver transistors 332b and 334b can be disposed on the substrate 350 and be connected to the access transistors 302 and 304 through a plurality of metallization layers and via structures. For example, the word line driver transistor 332b can be connected to a word line WL that is disposed in a plurality of metallization layers (e.g., MP, M0 . . . Mn) and a plurality of via structures (e.g., VG, V0 . . . Vn−1) which are connected to one or more access transistors 302. Also, the word line driver transistor 334b can be connected to a word line WL that is disposed in a plurality of metallization layers (e.g., MP, M0 . . . Mn) and a plurality of via structures (e.g., VG, V0 . . . Vn−1) which are connected to one or more access transistors 304.

FIG. 3B shows that the gate terminal of the word line driver transistor 332b is connected to the word line WL (e.g., through metallization layers MP, M0 . . . Mn and via structures VG, V0 . . . Vn−1) which is connected to the access transistors 302, and the gate terminal of the word line driver transistor 334b is connected to the word line WL (e.g., through metallization layers MP, M0 . . . Mn and via structures VG, V0 . . . Vn−1) which is connected to the access transistors 304. However, embodiments are not limited thereto, and the source terminal and/or drain terminal can be connected to the word lines WL. For example, when the source terminal of the word line driver transistor 332b is connected to the word line WL, a via structure VS can be disposed below the metallization layer MP and connected to the source terminal of the word line driver transistor 332b. Similar via structures (e.g., via structure VD for the drain terminal, etc.) can be formed to connect the source terminal and/or drain terminal of the word line driver transistors 332b and 334b to the word lines WL. Accordingly, the word line driver of the memory device 300 including the word line driver transistors 332b and 334b can drive word line WL to access the access transistors 302 and 304, respectively.

Figure 4:
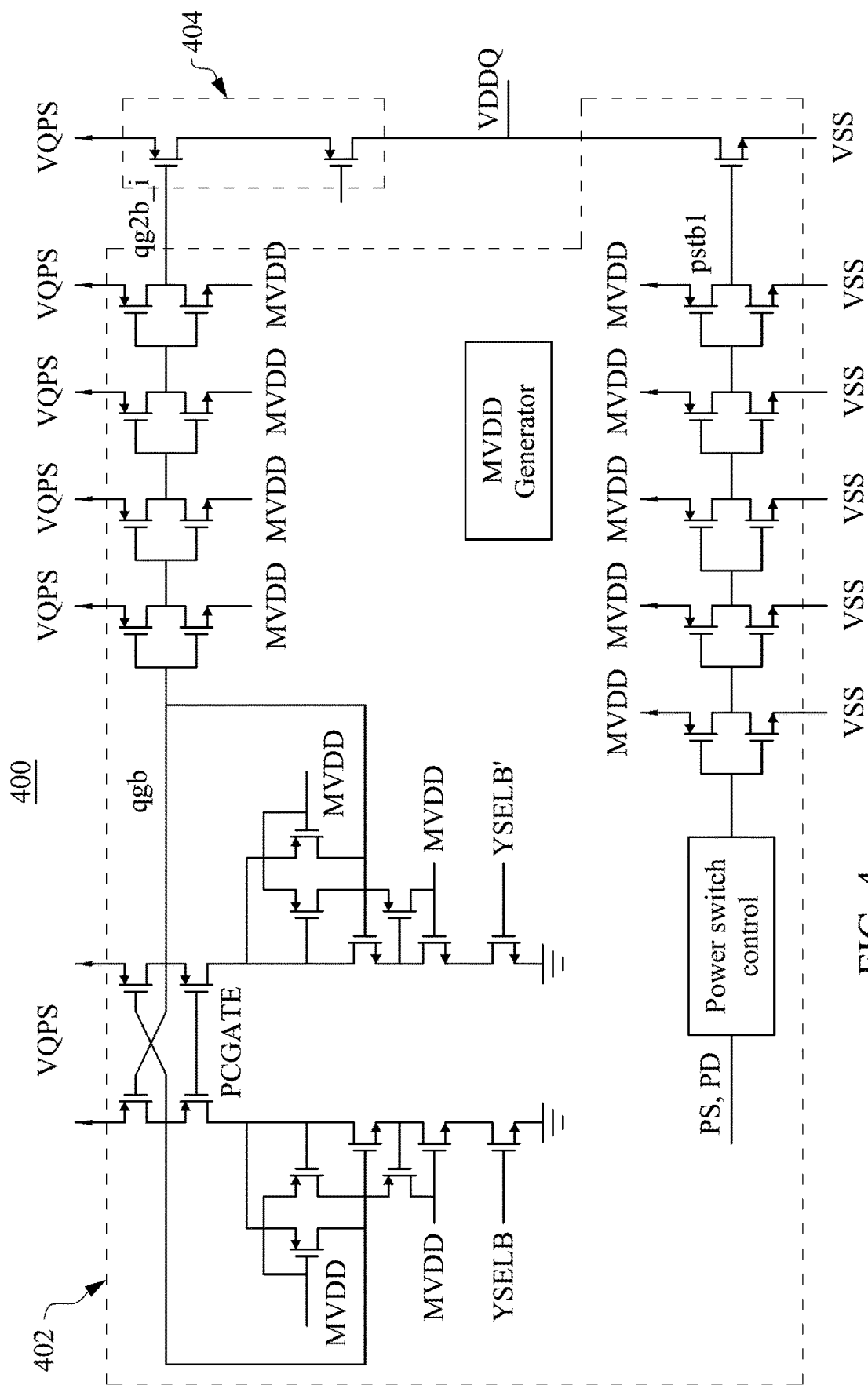
FIG. 4 illustrates an example circuit diagram of a power switch of a memory device, in accordance with some embodiments.

FIG. 4 illustrates a circuit diagram of a power switch 400 of a memory device, in accordance with some embodiments. The power switch 400 can provide power to a bit line BL during a program mode of a memory cell of the memory device. The power switch 400 can include a power switch control circuit 402 and a power switch supply circuit 404. Although a certain schematic for the power switch 400 is shown, embodiments are not limited thereto, and other power switches can be used.

The power switch control circuit 402 can control the power switch supply circuit 404 by controlling one or more transistors in the power switch supply circuit 404. For example, the power switch control circuit 402 can provide a turn-on voltage and/or a turn-off voltage to gate terminals of the one or more transistors in the power switch supply circuit 404. In addition to the circuits shown in FIG. 4, the power switch control circuit 402 can also include other types of circuits such as multiplexors, pass gate transistors, and level shifters. A multiplexor includes an n-to-1 gate where the gate has n inputs and one output. The output is determined by control signals (that can have m number of bits) that is also input to the multiplexor. For example, a control signal of "0"

may provide as an output the 1st input, a control signal of "1" may provide as an output the $2^{nd}$ input, etc. A pass gate transistor is a transistor that can be used as switches. For example, one of the source/drain terminals of the pass gate transistor can be the input, and the other one of the source/drain terminals can be the output. The gate terminal of the pass gate transistor can receive a turn-on or turn-off voltage, which can control the pass gate transistor to turn on or turn off, thereby allowing the input signal to be transferred to the output. A level shifter can include a circuit that translates signals from one logic level to another logic level. For example, if an input/output voltage of a first sub-circuit is operating at 1.35V, and a second sub-circuit connected to the first sub-circuit is operating at 1.8V, the level shifter can bridge the first and second sub-circuits together and allow the two sub-circuits operate together.

The program voltage VDDQ can be connected to the bit lines BL which can be at least partially disposed in the metallization layer M2. When a control signal PS is high (e.g., has a logical 1), the program voltage VDDQ can be similar to a supply voltage VQPS which can be about 1.8V. When the control signal PS is low (e.g., has a logical 0), the program voltage VDDQ can be similar to the voltage VSS which can be about 0V. Accordingly, the power switch 400 can provide a program voltage VDDQ during a program mode of the memory device and help prevent or reduce overvoltage stress in the memory device. An MVDD generator can provide supply voltage MVDD to various components within the power switch control circuit 402. Furthermore, various control signals such as YSELB and PCGATE can be used to provide an input signal for a level shifter and other sub-components of the switch control circuit 402 connected to the power switch supply circuit 404.

Figure 5:
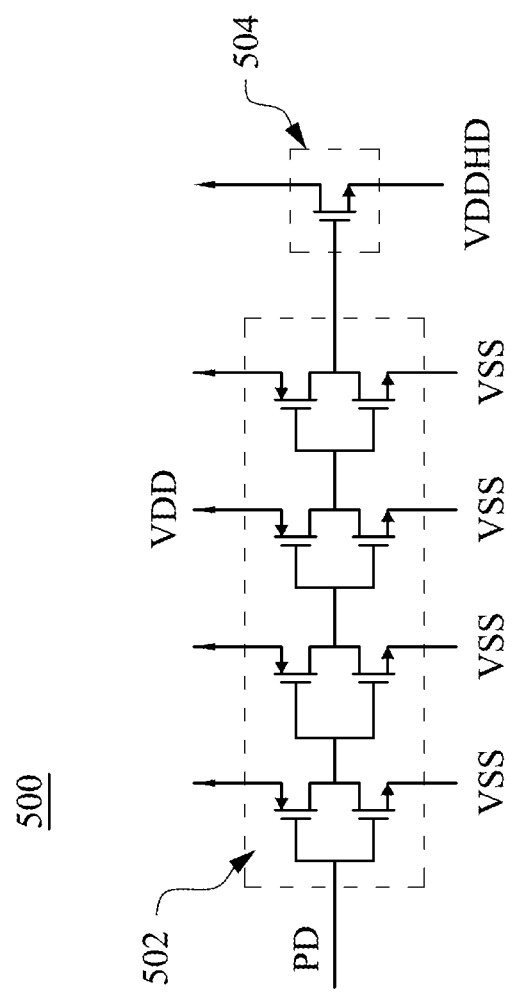
FIG. 5 illustrates an example circuit diagram of a header circuit of a memory device, in accordance with some embodiments.

FIG. 5 illustrates a circuit diagram of a header circuit 500 of a memory device, in accordance with some embodiments. The header circuit 500 can be included in the memory device 300 to provide power to a bit line BL during a reading mode of a memory cell of the memory device 300. The header circuit 500 can include a header control circuit 502 and a header supply circuit 504. Although a certain schematic for the header circuit 500 is shown, embodiments are not limited thereto, and other header circuits can be used.

The header control circuit 502 can control the header supply circuit 504 including header circuit transistors (or power-saving transistors) by controlling one or more transistors in the header supply circuit 504. For example, the header control circuit 502 can provide a turn-on voltage and/or a turn-off voltage to gate terminals of the one or more transistors in the header supply circuit 504. The reading voltage VDDHD can be connected to the bit lines BL which can be at least partially disposed in the metallization layer M2. When a control signal PD is high (e.g., has a logical 1), the reading voltage VDDHD can be set to about 0V. When the control signal PS is low (e.g., has a logical 0), the reading voltage VDDHD can be similar to the voltage VDD which can be about 0.75V. Accordingly, the header circuit 500 can provide a reading voltage VDDHD during a reading mode of the memory device and help reduce power usage or save power during non-operation of the memory device. The header supply circuit 504 can include a buffer (e.g., a series of inverters), that can propagate the controls signal PD from an input of the header control circuit 502 to an output of the control circuit 502 that is connected to an input of the header supply circuit 504.

Figure 6A:
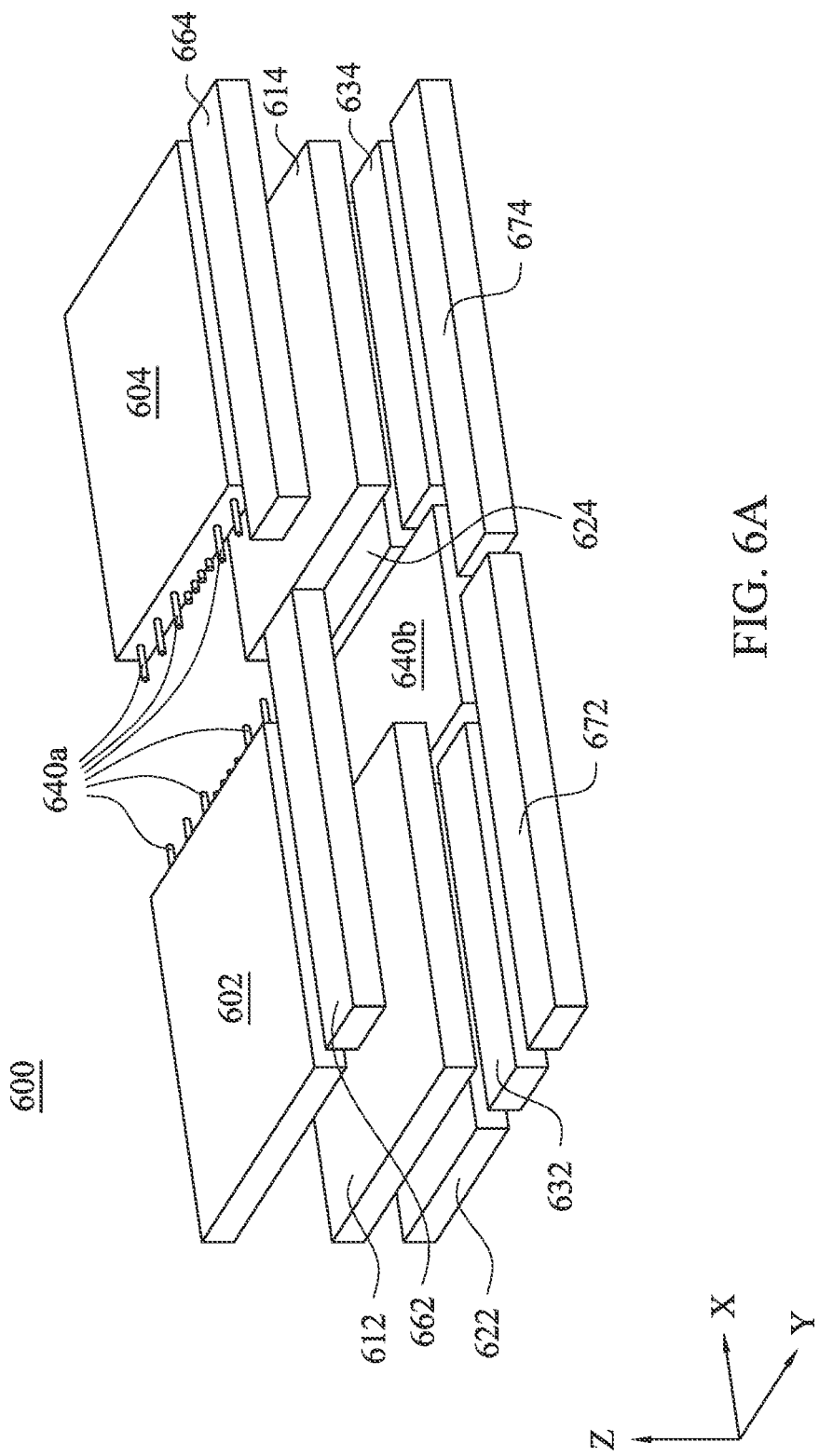
FIG. 6A illustrates a 3D perspective view of a block diagram of an example memory device, in accordance with some embodiments.

FIG. 6A illustrates a 3D perspective view of a block diagram of an example memory device 600, in accordance with some embodiments. The memory device 600 is similar to the memory device 300 of FIGS. 3A and 3B. For example, the memory device 600 includes a plurality of access transistors 602 and 604 (similar to the access transistors 302 and 304), a plurality of fuse resistors 612 and 614 (similar to the fuse resistors 312, 314), control circuits 622 and 624 (similar to the control circuits 322, 324), word lines 640a (similar to the word lines 340a), a word line driver 640b (similar to the word line driver 340b), and sense amplifiers 632 and 634 (similar to the sense amplifiers 332, 334). However, the memory device 600 also includes a power switch supply circuit 662 (e.g., power switch supply circuit 404), a header supply circuit 664 (e.g., header supply circuit 504), a power switch control circuit 672 (e.g., power switch control circuit 402), and a header control circuit 674 (e.g., header control circuit 502). Although FIG. 6A shows a certain number of blocks of circuits, elements are not limited thereto, and there can be more or fewer circuits in the memory device 600.

The power switch supply circuit 662 can be disposed adjacent to the access transistors 602. For example, the power switch supply circuit 662 can be disposed on the same layer as the access transistors 602. The power switch control circuit 672 can be disposed below the power switch supply circuit 662. For example, the power switch control circuit 672 can be disposed on the substrate and adjacent to the sense amplifiers 632 and the control circuits 622. Similar to the access transistors 302 and 304 discussed with reference to FIGS. 3A and 3B, the transistors in the power switch supply circuit 662 and the header supply circuit 664 can be formed as back-gate transistors. A back-gate transistor can include a vertically integrated transistor including a gate terminal, source terminal, and a drain terminal. The gate terminal can be disposed closer to the substrate than the source and drain terminals. The back-gate transistor can be formed without high temperature processes (e.g., for annealing), which allows the back-gate transistor to be formed during a BEOL process and over various interconnect structures because the interconnect structures will not be damaged due to the high temperatures. Including back-gate transistors can advantageously reduce circuit area because the back-gate transistors can be formed over the interconnect structures and transistors that are formed during a FEOL process on the substrate.

The header supply circuit 664 can be disposed adjacent to the access transistors 604. For example, the header supply circuit 664 can be disposed on the same layer as the access transistors 604. The header control circuit 674 can be disposed below the header supply circuit 664. For example, the header control circuit 674 can be disposed on the substrate and adjacent to the sense amplifiers 634 and the control circuits 624.

Similar to the access transistors 302 and 304 discussed with reference to FIGS. 3A and 3B, the transistors in the power switch supply circuit 662 and the header supply circuit 664 can be formed as back-gate transistors. For example, the p-type transistors in the power switch supply circuit 662 (e.g., PMOS transistors in the power switch supply circuit 404) can be formed with a gate terminal below the active region, and the p-type transistors of the header supply circuit 664 (e.g., PMOS transistors in the header supply circuit 504) can be formed with a gate terminal below the active region.

Figure 6B:
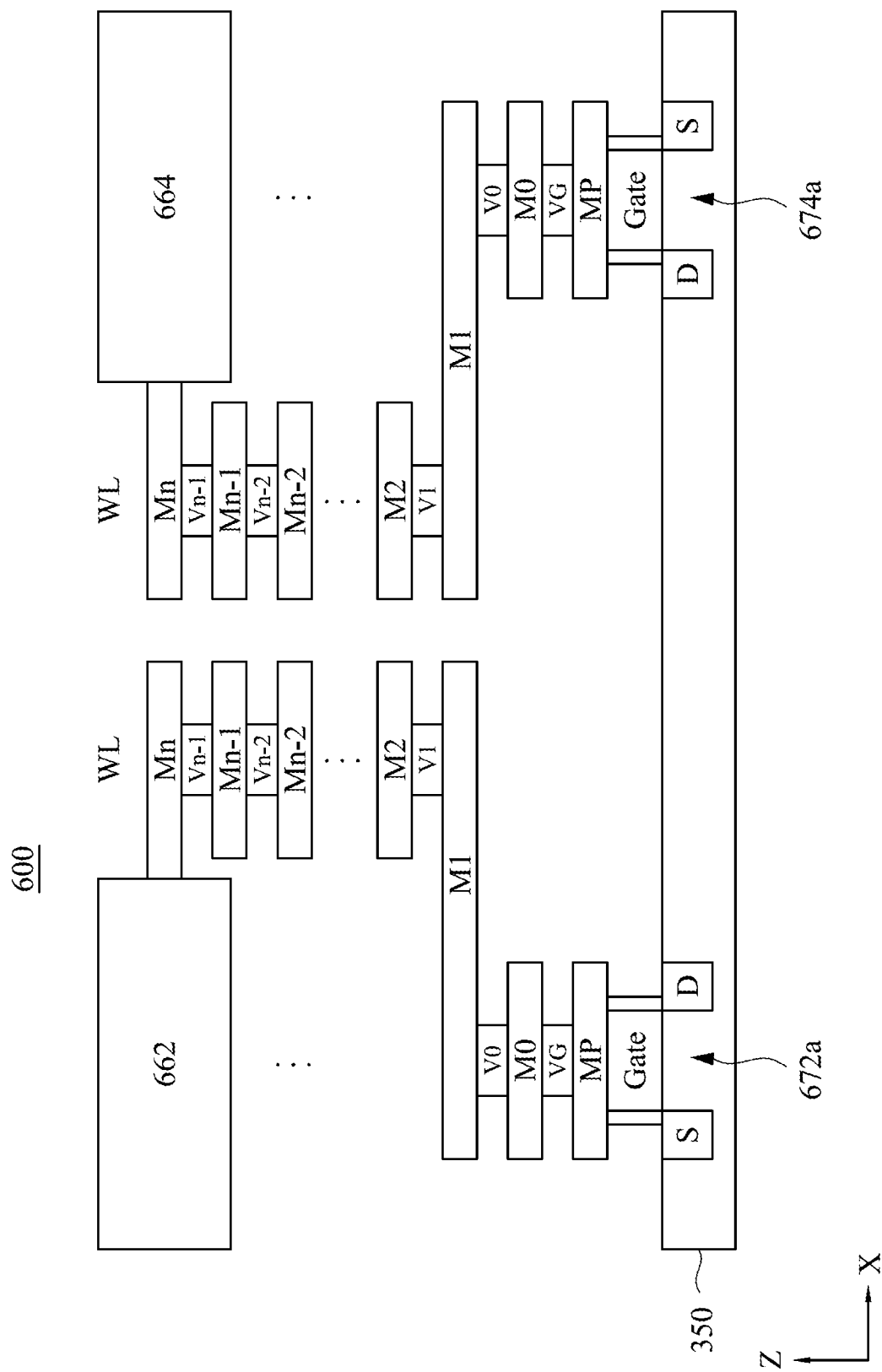
FIG. 6B illustrates a cross-sectional view of the memory device of FIG. 6A, in accordance with some embodiments.

FIG. 6B illustrates a cross-sectional view of the example memory device 600 of FIG. 6A, in accordance with some embodiments. The memory device 600 as shown in FIG. 6B includes the power switch supply circuit 662 and the header supply circuit 664 formed over power switch transistor 672a and header circuit transistor 674*a*. The power switch transistor 672*a* can be a transistor in the power switch control circuit 672 that is connected to the power switch supply circuit 662, and the header circuit transistor 674*a* can be a transistor in the header control circuit 674 that is connected to the header supply circuit 664.

Each of the power switch transistor 672*a* and the header circuit transistor 674*a* has a gate terminal, a source terminal and a drain terminal. The power switch transistor 672*a* and the header circuit transistor 674*a* can be disposed on a substrate 650 and be connected to the power switch supply circuit 662 and the header supply circuit 664 through a plurality of metallization layers and via structures. For example, the power switch transistor 672*a* can be connected to a first signal line that is disposed in a plurality of metallization layers (e.g., MP, M0 . . . Mn) and a plurality of via structures (e.g., VG, V0 . . . Vn−1) which are connected to one or more transistors in the power switch supply circuit 662 (e.g., power switch supply circuit 404). Also, the header circuit transistor 674*a* can be connected to a second signal line that is disposed in a plurality of metallization layers (e.g., MP, M0 . . . Mn) and a plurality of via structures (e.g., VG, V0 . . . Vn−1) which are connected to one or more transistors in the header supply circuit 664 (e.g., header supply circuit 504).

FIG. 6B illustrates the gate terminal of the power switch transistor 672*a* to be connected to the first signal line (e.g., through metallization layers MP, M0 . . . Mn and via structures VG, V0 . . . Vn−1) which is connected to the power switch supply circuit 662, and the gate terminal of the header circuit transistor 674*a* is connected to the second signal line (e.g., through metallization layers MP, M0 . . . Mn and via structures VG, V0 . . . Vn−1) which is connected to the header supply circuit 664. However, embodiments are not limited thereto, and the source terminal and/or drain terminal can be connected to the first and second signal lines. For example, when the source terminal of the power switch transistor 672*a* is connected to the first signal line, a via structure VS can be disposed below the metallization layer MP and connected to the source terminal of the power switch transistor 672*a*. Similar via structures (e.g., via structure VD for the drain terminal, etc.) can be formed to connect the source terminal and/or drain terminal of each of the power switch transistor 672*a* and the header circuit transistor 674*a* to the first and second signal lines, respectively. Accordingly, the power switch control circuit 672 including the power switch transistor 672*a* and the header control circuit 674 including the header circuit transistor 674*a* can control the power switch supply circuit 662 and the header supply circuit 664, respectively.

Figure 7:
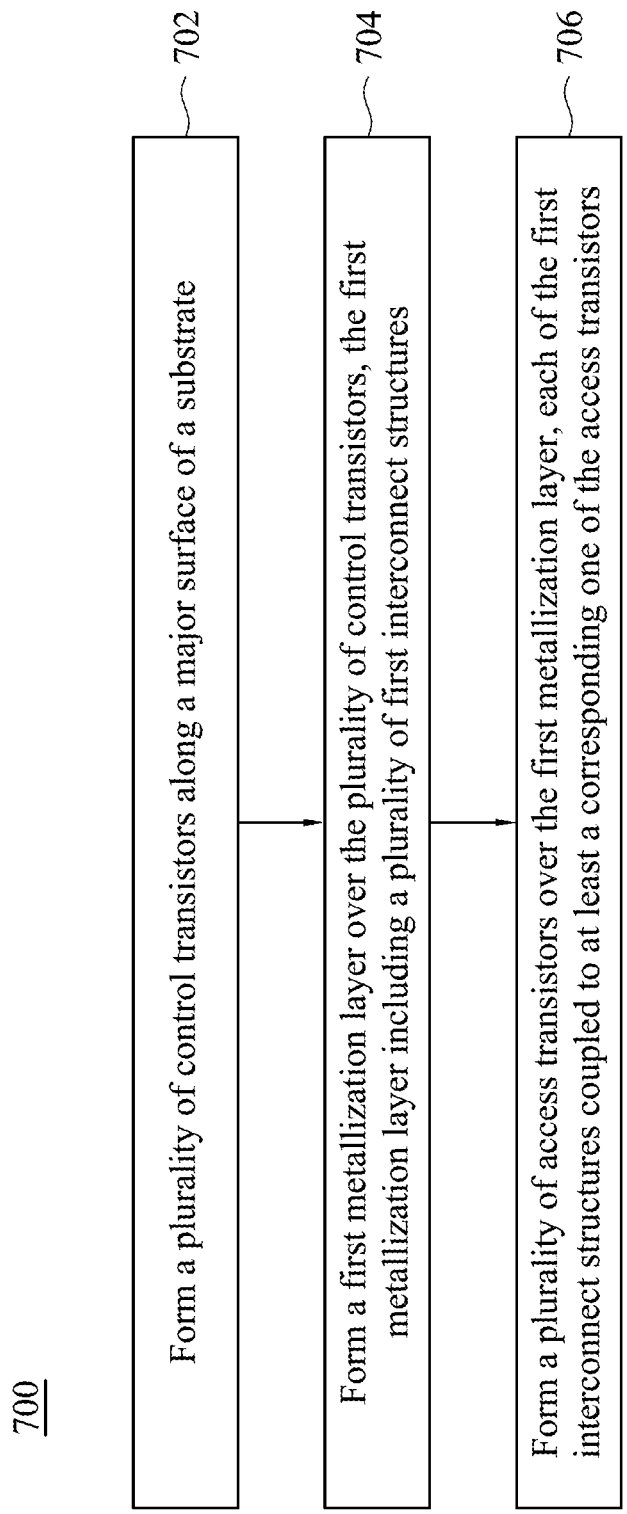
FIG. 7 illustrates a flowchart of an example method of fabricating a memory device, in accordance with some embodiments.

FIG. 7 illustrates a flowchart of an example method 700 of fabricating a memory device, in accordance with some embodiments. The method 700 may be used to form a memory device including access transistors above the fuse resistors. For example, at least some of the operations described in the method 700 may be used to form the memory cell 300 (FIGS. 3A-3B) and the memory cell 600 (FIGS. 6A-6B). It is noted that the method 700 is merely an example and is not intended to limit the present disclosure. Accordingly, it is understood that additional operations may be provided before, during, and after the method 700 of FIG. 7, and that some other operations may only be briefly described herein.

In brief overview, the method 700 starts with operation 702 in which a plurality of control transistors is formed along a major surface of a substrate. The method 700 proceeds to operation 704 in which a first metallization layer is formed over the plurality of control transistors, the first metallization layer including a plurality of first interconnect structures. The method 700 proceeds to operation 706 in which a plurality of access transistors is formed over the first metallization layer, each of the first interconnect structures coupled to at least a corresponding one of the access transistors.

Referring to operation 702, a plurality of control transistors can be formed along a major surface (or first surface) of the substrate (e.g., substrate 350, substrate 650). For example, the control transistors formed in operation 702 can include one or more of the sense amplifier transistors 332*a* and 334*a*, word line driver transistors 332*b* and 334*b*, the power switch transistor 672*a*, the header circuit transistor 674*a*, any other transistor that is part of the controller 102, the power switch control circuit 402, header control circuit 502, etc.

Referring to operation 704, a plurality of metallization layers and via structures can be formed over the control transistors. For example, the metallization layers can include metallization layers MD, MP, M0, M1 . . . Mn, where "n" is any natural number, and each of the metallization layers can include one or more interconnect structures. Also, the via structures can include via structure VG, VD, VS, V0 . . . Vn−1. Furthermore, a fuse resistor can be formed in an interconnect structure in any of the metallization layers, e.g., metallization layer M2.

Referring to operation 706, access transistors can be formed over the metallization layers and the via structures during a BEOL process. For example, the access transistors can include one or more of the access transistors 302 and 304. The access transistors, formed as back-gate transistors, formed in operation 706 and the fuse resistors formed in the operation 704 can form OTP memory cells (e.g., eFuse cells). Furthermore, the power switch supply circuit 662 and/or the header supply circuit 664 can also be formed over the metallization layers and the via structures as back-gate transistors. Accordingly, a variety of transistors, both n-type and p-type, can be formed over the control transistors and the metallization layers.

In one aspect of the present disclosure, a memory device is disclosed. The memory device includes a plurality of memory cells, each of the memory cells including an access transistor and a resistor coupled to each other in series. The resistors of the memory cells are each formed as one of a plurality of interconnect structures disposed over a substrate. The access transistors of the memory cells are disposed opposite a first metallization layer containing the plurality of interconnect structures from the substrate.

In another aspect of the present disclosure, a memory system is disclosed. The memory system includes a first memory array including a plurality of first memory cells, wherein each of the plurality of first memory cells includes a resistor and one or more access transistors each coupled to the resistor in series. The memory system includes a plurality of first control circuits configured to access the first memory array, wherein each of the plurality of first control circuits includes one or more control transistors. The access transistors of the first memory cells are vertically disposed over the resistors of the first memory cells, and the resistors of the first memory cells are vertically disposed over the control transistors of the first control circuits.

In yet another aspect of the present disclosure, a method for fabricating a memory device is disclosed. The method includes forming a plurality of control transistors along a major surface of a substrate and forming a first metallization layer over the plurality of control transistors. The first metallization layer includes a plurality of first interconnect structures. The method also includes forming a plurality of access transistors over the first metallization layer, and the first interconnect structures are each coupled to at least a corresponding one of the access transistors in series, thereby forming a plurality of one-time programmable (OTP) memory cells.

As used herein, the terms "about" and "approximately" generally mean plus or minus 10% of the stated value. For example, about 0.5 would include 0.45 to 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells, each of the memory cells including an access transistor and a resistor coupled to each other in series, wherein each of the memory cells includes a one-time programmable (OTP) electrical fuse;
wherein the resistors of the memory cells are each configured to be programmed from a first resistance state to a second resistance state and are formed as one of a plurality of metal structures disposed over a substrate; and
wherein the access transistors of the memory cells are disposed opposite a first metallization layer containing the plurality of metal structures from the substrate.

2. The memory device of claim 1, wherein each of the resistors is configured to be irreversibly programmed from the first resistance state that presents a low resistance state to the second resistance state that presents a high resistance state.

3. The memory device of claim 1, further comprising a plurality of second metallization layers, each of which contains a corresponding plurality of metal structures, disposed between the access transistors and the first metallization layer.

4. The memory device of claim 3, wherein at least one of the metal structures of each of the second metallization layers electrically couples one or more of the access transistors to a corresponding one of the resistors.

5. The memory device of claim 1, wherein each of the access transistors is formed as a back-gate transistor including a source terminal, a drain terminal, and a gate terminal that is disposed closer to the substrate than the source and drain terminals.

6. The memory device of claim 1, further comprising a plurality of control transistors formed along a major surface of the substrate.

7. The memory device of claim 6, wherein each of the plurality of control transistors is configured to control at least a corresponding one of the memory cells.

8. The memory device of claim 1, further comprising a plurality of power-related transistors that are also laterally disposed with respect to the access transistors, wherein each of the plurality of power-related transistors is configured to couple a power supply to one or more of the memory cells during a program mode.

9. The memory device of claim 1, further comprising a plurality of power-saving transistors that are also laterally disposed with respect to the access transistors, wherein each of the plurality of power-saving transistors is configured to turn off the memory cells so as to save power.

10. A method for fabricating a memory device, comprising:
forming a plurality of control transistors along a major surface of a substrate;
forming a first metallization layer over the plurality of control transistors, wherein the first metallization layer includes a plurality of first interconnect structures that operatively serve as a plurality of resistors, respectively; and
forming a plurality of access transistors over the first metallization layer;
wherein the first interconnect structures are each coupled to at least a corresponding one of the access transistors in series, thereby forming a plurality of one-time programmable (OTP) memory cells.

11. The method of claim 10, further comprising:
forming a plurality of second metallization layers between the plurality of control transistors and the plurality of access transistors, each of the plurality of second metallization layers including a plurality of second interconnect structures;
wherein each of the OTP memory cells is operatively coupled to one or more corresponding ones of the plurality of control transistors through one or more of the second interconnect structures.

12. The method of claim 10, wherein each of the plurality of control transistors is configured to control at least a corresponding one of the OTP memory cells.

13. The method of claim 10, further comprising:
forming a plurality of power-related transistors that are also laterally disposed with respect to the access transistors;
wherein each of the plurality of power-related transistors is configured to couple a power supply to one or more of the OTP memory cells during a program mode.

14. The method of claim 10, further comprising:
forming a plurality of power-saving transistors that are also laterally disposed with respect to the access transistors;
wherein each of the plurality of power-saving transistors is configured to turn off the OTP memory cells so as to save power.

15. A memory device, comprising:
a plurality of control transistors along a major surface of a substrate;
a plurality of first interconnect structures disposed in a first one of a plurality of metallization layers over the plurality of control transistors; and
a plurality of access transistors disposed over the first metallization layer;
wherein each of the first interconnect structures and a corresponding one of the access transistors operatively serve as a resistor and an access transistor of a respective one of a plurality of one-time programmable (OTP) electrical fuse, respectively;
wherein the resistor and the access transistor of each of the OTP electrical fuses are coupled to each other in series.

16. The memory device of claim 15, wherein each of the access transistors is formed as a back-gate transistor including a source terminal, a drain terminal, and a gate terminal that is disposed closer to the substrate than the source and drain terminals.

17. The memory device of claim 15, wherein each of the resistors is configured to be irreversibly programmed from a low resistance state to a high resistance state.

18. The memory device of claim 15, wherein each of the plurality of control transistors is configured to control at least a corresponding one of the OTP electrical fuses.

19. The memory device of claim 15, further comprising a plurality of power-related transistors that are also laterally disposed with respect to the access transistors, wherein each of the plurality of power-related transistors is configured to couple a power supply to one or more of the OTP electrical fuses during a program mode.

20. The memory device of claim 15, further comprising a plurality of power-saving transistors that are also laterally disposed with respect to the access transistors, wherein each of the plurality of power-saving transistors is configured to turn off the OTP electrical fuses so as to save power.

* * * * *